(12) United States Patent
Holmer

(10) Patent No.: US 8,819,525 B1
(45) Date of Patent: Aug. 26, 2014

(54) ERROR CONCEALMENT GUIDED ROBUSTNESS

(75) Inventor: Stefan Holmer, Stockholm (SE)

(73) Assignee: Google Inc., Mountain View, CA (US)

( * ) Notice: Subject to any disclaimer, the term of this patent is extended or adjusted under 35 U.S.C. 154(b) by 196 days.

(21) Appl. No.: 13/523,072

(22) Filed: Jun. 14, 2012

(51) Int. Cl.
*H03M 13/00* (2006.01)
*H03M 13/03* (2006.01)
*H03M 13/33* (2006.01)
*H04L 1/00* (2006.01)
*H03M 13/45* (2006.01)

(52) U.S. Cl.
CPC .............. *H03M 13/33* (2013.01); *H04L 1/0041* (2013.01); *H04L 1/0045* (2013.01); *H03M 13/45* (2013.01)
USPC ........... 714/775; 714/776; 714/780; 714/798; 714/821

(58) Field of Classification Search
None
See application file for complete search history.

(56) References Cited

U.S. PATENT DOCUMENTS

| | | |
|---|---|---|
| 5,371,841 A | 12/1994 | Jones |
| 5,442,458 A | 8/1995 | Rabbani et al. |
| 5,461,423 A | 10/1995 | Tsukagoshi |
| 5,483,287 A | 1/1996 | Siracusa |
| 5,586,285 A | 12/1996 | Hasbun et al. |
| 5,686,962 A | 11/1997 | Chung et al. |
| 5,717,394 A | 2/1998 | Schwartz et al. |
| 5,767,909 A | 6/1998 | Jung |
| 5,818,536 A | 10/1998 | Morris et al. |
| 5,881,173 A | 3/1999 | Ohmori |
| 5,903,382 A | 5/1999 | Tench et al. |
| 5,926,226 A | 7/1999 | Proctor et al. |
| 6,009,203 A | 12/1999 | Liu et al. |
| 6,381,371 B1 | 4/2002 | Epstein et al. |
| 6,385,341 B1 | 5/2002 | Lisitsa et al. |
| 6,473,463 B2 | 10/2002 | Agarwal |
| 6,591,013 B1 | 7/2003 | Taunton |
| 6,658,153 B1 | 12/2003 | Nakagawa et al. |
| 6,661,842 B1 | 12/2003 | Abousleman |
| 6,690,832 B1 | 2/2004 | Mitchell et al. |
| 6,819,803 B2 | 11/2004 | Mitchell et al. |

(Continued)

FOREIGN PATENT DOCUMENTS

| | | |
|---|---|---|
| EP | 1351510 | 10/2003 |
| EP | 1947680 | 7/2008 |

(Continued)

OTHER PUBLICATIONS

Cui et al., Novel Tempral Error Concealment Algorithm Based on Residue Restoration, Sep. 24, 2009, IEEE, pp. 1-4.

(Continued)

*Primary Examiner* — Daniel McMahon
(74) *Attorney, Agent, or Firm* — Young Basile Hanlon & MacFarlane P.C.

(57) ABSTRACT

Error concealment guided robustness may include identifying a current portion of a current video stream. Identifying the current portion may include identifying a feature, or a vector of features, for the current portion. An estimated vulnerability metric may be identified based on the feature and an associated learned feature weight. An error correction code for the current portion may be generated based on the estimated vulnerability metric. Error concealment guided robustness may include generating learned feature weights based on one or more training videos by generating vulnerability metrics for the training videos and identifying relationships between features of the training videos and the vulnerability metrics generated for the training videos.

23 Claims, 13 Drawing Sheets

(56) References Cited

U.S. PATENT DOCUMENTS

| | | | |
|---|---|---|---|
| 6,879,725 | B2 | 4/2005 | Rijavec et al. |
| 6,941,019 | B1 | 9/2005 | Mitchell et al. |
| 6,950,469 | B2 | 9/2005 | Karczewicz et al. |
| 6,985,527 | B2 | 1/2006 | Gunter et al. |
| 6,993,075 | B2 | 1/2006 | Kim et al. |
| 7,003,033 | B2 | 2/2006 | Kim et al. |
| 7,116,831 | B2 | 10/2006 | Mukerjee et al. |
| 7,146,053 | B1 | 12/2006 | Rijavec et al. |
| 7,164,717 | B2 | 1/2007 | Katsavounidis et al. |
| 7,221,706 | B2 | 5/2007 | Zhao et al. |
| 7,336,836 | B2 | 2/2008 | Mitchell et al. |
| 7,685,494 | B1 | 3/2010 | Varnica et al. |
| 7,697,769 | B2 | 4/2010 | Baba et al. |
| 7,979,774 | B1 | 7/2011 | Varnica et al. |
| 7,991,055 | B2 | 8/2011 | Cancemi et al. |
| 7,997,953 | B2 | 8/2011 | Kamiya et al. |
| 8,107,539 | B2 | 1/2012 | Hannuksela et al. |
| 8,130,823 | B2 | 3/2012 | Gordon et al. |
| 8,209,580 | B1 | 6/2012 | Varnica et al. |
| 8,488,915 | B2 * | 7/2013 | Jayant et al. ............ 382/309 |
| 8,630,341 | B2 * | 1/2014 | Cohen et al. ........... 375/240.03 |
| 2001/0022815 | A1 | 9/2001 | Agarwal |
| 2002/0036705 | A1 | 3/2002 | Lee et al. |
| 2002/0172289 | A1 | 11/2002 | Akiyoshi et al. |
| 2003/0053454 | A1 | 3/2003 | Katsavounidis et al. |
| 2003/0081850 | A1 | 5/2003 | Karczewicz et al. |
| 2003/0081852 | A1 * | 5/2003 | Pohjola .................. 382/253 |
| 2004/0013308 | A1 | 1/2004 | Jeon et al. |
| 2006/0098738 | A1 | 5/2006 | Cosman et al. |
| 2006/0256232 | A1 | 11/2006 | Noguchi |
| 2007/0005795 | A1 * | 1/2007 | Gonzalez ............... 709/232 |
| 2007/0092005 | A1 | 4/2007 | Kondo et al. |
| 2007/0150784 | A1 | 6/2007 | Pan et al. |
| 2007/0230585 | A1 | 10/2007 | Kim et al. |
| 2008/0008239 | A1 | 1/2008 | Song |
| 2008/0130756 | A1 | 6/2008 | Sekiguchi et al. |
| 2008/0170793 | A1 | 7/2008 | Yamada et al. |
| 2009/0052543 | A1 | 2/2009 | Wu et al. |
| 2009/0103635 | A1 | 4/2009 | Pahalawatta |
| 2009/0180671 | A1 | 7/2009 | Lee et al. |
| 2009/0208140 | A1 * | 8/2009 | Jayant et al. ............ 382/309 |
| 2009/0219994 | A1 | 9/2009 | Tu et al. |
| 2009/0284650 | A1 | 11/2009 | Yu et al. |
| 2010/0023837 | A1 | 1/2010 | Nakagawa |
| 2010/0086109 | A1 | 4/2010 | Lichorowic et al. |
| 2010/0158131 | A1 * | 6/2010 | Lakus-Becker et al. . 375/240.25 |
| 2011/0200111 | A1 | 8/2011 | Chen et al. |
| 2012/0082220 | A1 * | 4/2012 | Mazurenko et al. ..... 375/240.12 |
| 2012/0082225 | A1 | 4/2012 | Chen et al. |
| 2012/0127187 | A1 * | 5/2012 | Bratt et al. ............. 345/547 |
| 2012/0290900 | A1 * | 11/2012 | Paniconi .............. 714/776 |
| 2013/0027561 | A1 * | 1/2013 | Lee et al. ............. 348/150 |
| 2013/0100173 | A1 * | 4/2013 | Chaji et al. ........... 345/690 |
| 2013/0125164 | A1 * | 5/2013 | Sharif-Ahmadi et al. ..... 725/31 |
| 2013/0191872 | A1 * | 7/2013 | Lee et al. ............ 725/78 |
| 2013/0279589 | A1 * | 10/2013 | Gu et al. ............. 375/240.16 |
| 2013/0293725 | A1 * | 11/2013 | Zhang et al. ........... 348/180 |
| 2013/0340022 | A1 * | 12/2013 | Antonov et al. ........... 725/116 |

FOREIGN PATENT DOCUMENTS

| | | |
|---|---|---|
| EP | 1947860 | 7/2008 |
| JP | 61092073 | 5/1986 |
| JP | 2217088 | 8/1990 |
| JP | 2272970 | 11/1990 |
| JP | 8280032 | 10/1996 |
| JP | 09037246 | 7/1997 |
| JP | 09247682 | 9/1997 |
| JP | 11262018 | 9/1999 |
| JP | 11289544 | 10/1999 |
| JP | 11313332 | 11/1999 |
| JP | 11513205 | 11/1999 |
| JP | 2002141806 | 5/2002 |
| JP | 2003046944 | 2/2003 |
| JP | 2003235044 | 8/2003 |
| KR | 100213018 | 8/1999 |
| KR | 200130916 | 4/2001 |
| WO | WO0150770 | 7/2001 |
| WO | WO03026315 | 3/2003 |
| WO | WO2011150128 | 12/2011 |

OTHER PUBLICATIONS

Ding et al., A Novel Bitstream Level Joint Channel Error Concealment Scheme for Realtime video over Wireless Networks 2004, IEEE, pp. 1-11.

Fu et al. Combined Error Concealment and Error Correction in Rate Distortion Analysis for Multiple Substream Transmissions, Apr. 2007, IEEE, vol. 16, No. 4, pp. 1022-1035.

Kim, Joohee; Mersereau, Russell M. and Altunbasak, Yucel; "Distributed Video Streaming Using Multiple Description Coding and Unequal Error Protection", IEEE Transactions on Image Processing, vol. 14, No. 7, Jul. 2005 (13 pp.).

Kim, Joohee; Mersereau, Russell M. and Altunbasak, Yucel; "Error-Resilient Image and Video Transmission Over the Internet Using Unequal Error Protection", IEEE Transactions on Image Processing, vol. 12, No. 2, Feb. 2003 (11 pp.).

Kondrad, Lukasz; et al.; "Optimal FEC code concatenation for unequal error protection in video streaming applications", Tampere University of Technology, Tampere, Finland; Nokia Research Center, Tempere, Finland, Date Unknown, (8 pp.).

Lee et al., Partially Protected Caches to Reduce Failures due to Soft Errors in Multimedia Applications, 2006, Proceedings of International Conference on Compilers, Architectures and Synthesis for Embedded Systems (CASES) 2006. pp. 1-14.

Lee et al., Partitioning Techniques for Partially Protected Caches in Resource-Constrained Embedded Systems, ACM Transactions on Design Automation of Electronic Systems, vol. 15, No. 4, Article 30, Pub. Date: Sep. 2010, pp. 30:1-30:30.

Pinho Ducla Soares, Error Resilience for Object-Based Video Coding, Apr. 2004, Universidade Technica De Lisboa Instituto Superior Tecnico, pp. 1-274.

Sekiguchi S. et al.: "CE5: Results of Core Experiment on 4:4:4 Coding", JVT Meeting: Mar. 31, 2006-Jul. 4, 2006 Geneva, CH; (Joint Videoteam of ISO/IEC JTC1/SC29/WG11 and ITU-T Sg. 16), No. JVT-S014, Apr. 1, 2006 pp. 1-19.

Wiegand, Thomas, Study of Final Committee Draft of Joint Video Specification (ITU-T Rec. H.264 | ISO/IEC 14496-10 AVC), Joint Video Team (JVT) of ISO/IEC MPEG & ITU-T VCEG (ISO/IEC JTC1/SC29/WG11 and ITU-T SG16 Q.6), JVT-F100, Dec. 5, 2002.

Woo-Shik Kim et al.: "Enhancements to RGB coding in H.264/MPEG-4 AVC FRExt", Internet Citation, Apr. 16, 2005, XP002439981, Retrieved from the internet: URL:ftp3.itu.ch/av-arch/video-site/0504_Bus/VCEG-Z16.doc, retrieved on Jun. 28, 2007 p. 5.

* cited by examiner

ERROR CONCEALMENT GUIDED ROBUSTNESS

TECHNICAL FIELD

This application relates to video encoding and decoding.

BACKGROUND

Digital video can be used, for example, for remote business meetings via video conferencing, high definition video entertainment, video advertisements, or sharing of user-generated videos. Accordingly, it would be advantageous to provide high resolution video transmitted over communications channels having limited bandwidth.

SUMMARY

Disclosed herein are embodiments of systems, methods, and apparatuses for encoding a video signal.

One aspect of the disclosed embodiments is a method for generating error correction for a video stream. The method includes error concealment guided robustness. Error concealment guided robustness may include identifying a current portion of a current video stream. Identifying the current portion may include identifying a feature, or a vector of features, for the current portion. An estimated vulnerability metric may be identified based on the feature and an associated learned feature weight. An error correction code for the current portion may be generated based on the estimated vulnerability metric. Generating the error correction code may include using the estimated vulnerability metric to determine an amount of error correction data to include in the error correction code. Generating the error correction code may include generating a plurality of packets by packetizing the current portion and generating an error correction code for each packet in the plurality of packets.

Another aspect of the disclosed embodiments is an apparatus for error concealment guided robustness. The apparatus comprises a memory and at least one processor configured to execute instructions stored in the memory. The apparatus is configured to identify a current portion of a current video stream. The apparatus is configured to identifying a feature, or a vector of features, for the current portion. The apparatus is configured to identify an estimated vulnerability metric based on the feature and an associated learned feature weight. The apparatus is configured to generate an error correction code for the current portion based on the estimated vulnerability metric.

Another aspect of the disclosed embodiments is a method for generating learned feature weights. Learned feature weights may be generated based on one or more training videos by generating vulnerability metrics for the training videos and identifying relationships between features of the training videos and the vulnerability metrics generated for the training videos using machine learning. The learned vulnerability metrics may be stored, transmitted, or stored and transmitted.

Another aspect of the disclosed embodiments is an apparatus for generating learned feature weights. The apparatus comprises a memory and at least one processor configured to execute instructions stored in the memory. The apparatus is configured to generate learned feature weights based on one or more training videos by generating vulnerability metrics for the training videos and identifying relationships between features of the training videos and the vulnerability metrics generated for the training videos. The apparatus is configured to store the learned vulnerability metrics. The apparatus is configured to transmit the learned vulnerability metrics to another apparatus.

These and other embodiments will be described in additional detail hereafter.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
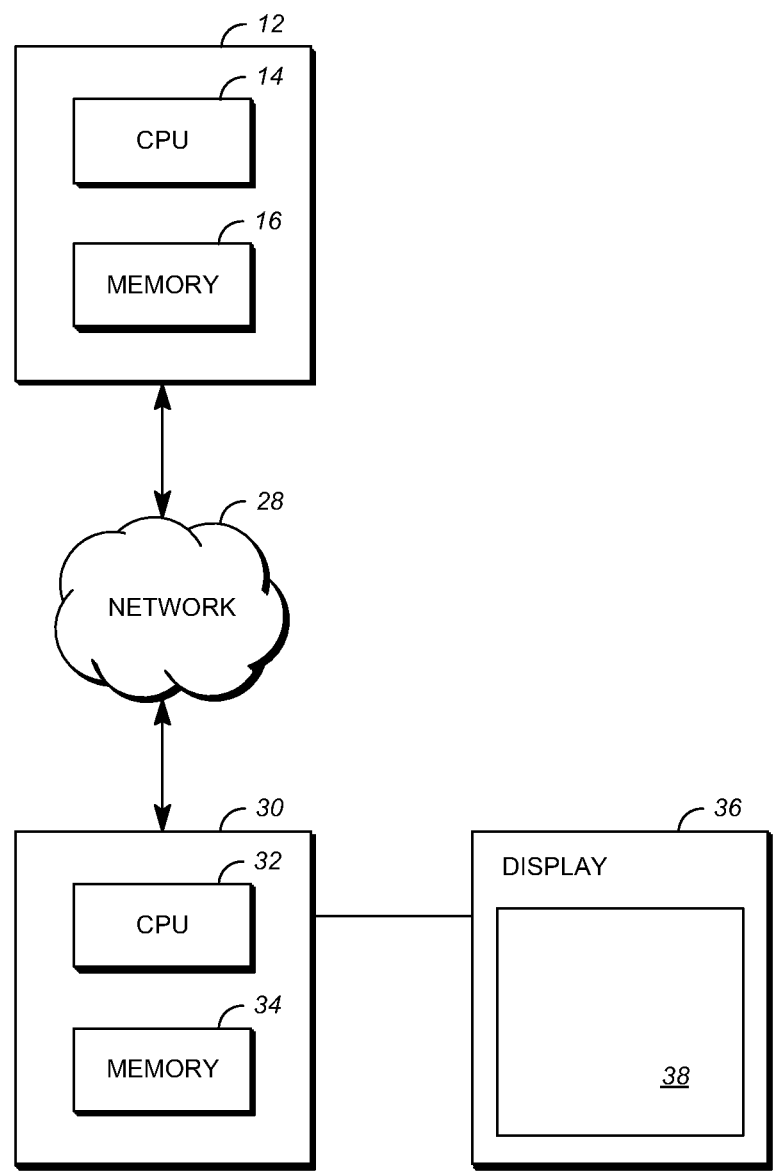
FIG. 1 is a schematic of a video encoding and decoding system.

Digital video is used for various purposes including, for example, remote business meetings via video conferencing, high definition video entertainment, video advertisements, and sharing of user-generated videos. Digital video streams can include formats such as VP8, promulgated by Google, Inc. of Mountain View, Calif., and H.264, a standard promulgated by ITU-T Video Coding Experts Group (VCEG) and the ISO/IEC Moving Picture Experts Group (MPEG), including present and future versions thereof.

Video can be transmitted from a sender over a network to one or more receivers. The network may not guaranteed delivery of data, and a received video stream may include transmission errors. For example, a receiver may not receive a portion of a transmitted video stream, such as a frame, a segment, a block, or a packet. Transmission errors, such as lost or dropped packets, can reduce the accuracy of reconstructing the video stream at a receiver. For example, transmission errors can cause visual distortion in a rendering of a reconstructed video stream. Transmission errors can be mitigated at the transmitter using, for example, forward error correction (FEC), and can be rectified at the receiver using, for example, error concealment.

Error correction, such as FEC, can be used by an encoder of a video stream to incorporate redundancy into an encoded video stream. The redundancy can be used to mitigate the effect of lost data by estimating the lost data at the receiver. The amount of lost data that can be estimated may be related to the amount of redundancy incorporated into the encoded video stream and the portion of the encoded video stream lost during transmission. An encoded video stream with less FEC (i.e. less redundant data) may be less protected against transmission loss than an encoded video stream including more FEC (i.e. more redundant data).

In an implementation, a consistent amount of error correction may be used for one or more portions of a video stream, such as each portion of the video stream. For example, a video stream may include frames and an equal amount of FEC may be applied to each frame in the video stream. A different amount of error correction may be used for different portions of a video stream. For example, a video stream may include multiple portions of multiple portion types, and the amount of FEC applied to a portion may be related to the portion type of the portion. For example, control data may be more useful for decoding a video frame than other data in the video frame. Accordingly, a first portion of a video frame may contain control data (e.g. motion vectors and coding modes) and may be encoded with more FEC and other portions of the video frame may be encoded using less FEC.

Error concealment can be used by a receiver to improve the accuracy of reconstructing a video stream that includes transmission error by estimating the lost data. For example, the receiver may include a motion vector estimator, a received video stream may be missing a motion vector, and the motion vector estimator may generate an estimated motion vector based on, for example, a previously decoded motion vector. For example, motion between a first frame and a second frame may be similar to motion between the second frame and a third frame, and motion vectors for the third frame can be estimated based on motion vectors for the second frame.

Implementations of error concealment guided robustness may include determining an error correction code, which may indicate an amount of error correction to apply to a portion of a video stream, based on the effect of a predicted transmission error on the accuracy of reconstructing the video stream. Error correction codes can be generated based on vulnerability metrics, estimated vulnerability metrics, or a combination thereof.

For example, vulnerability metrics may be generated for a current portion of a video stream based on encoding and decoding the current portion of the video stream, and estimated vulnerability metrics may be identified based on features of the current video stream and associated learned feature weights, which may be based on one or more training video streams. Error concealment guided robustness may include using machine learning to generate learned feature weights based on training video streams.

Figure 7:
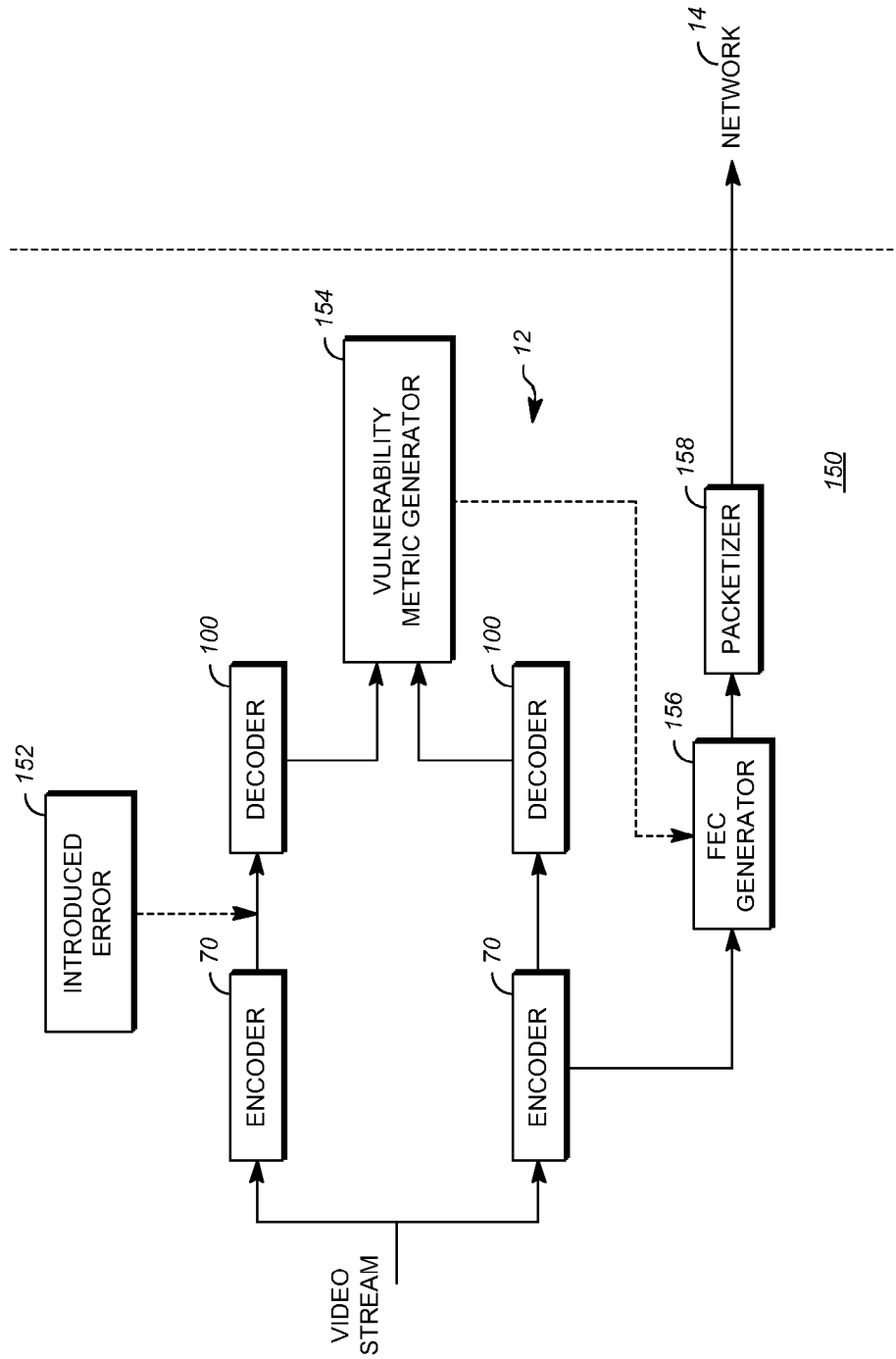
FIG. 7 is a block diagram of a video compression and packetizing system for generating FEC information based on one or more vulnerability metrics.
Figure 8:
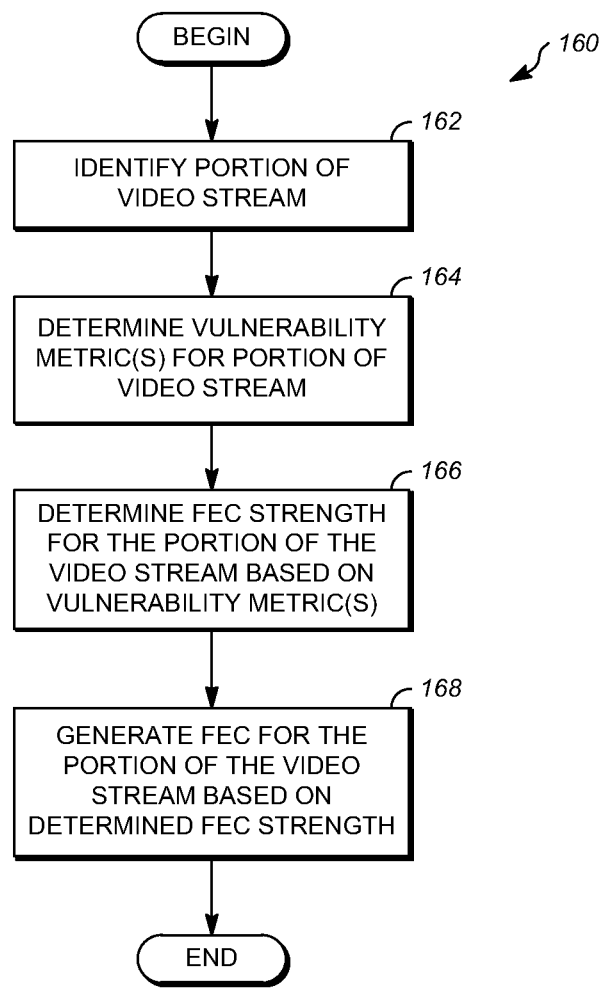
FIG. 8 is a flowchart of a technique of generating FEC information for a portion of a video stream.
Figure 9:
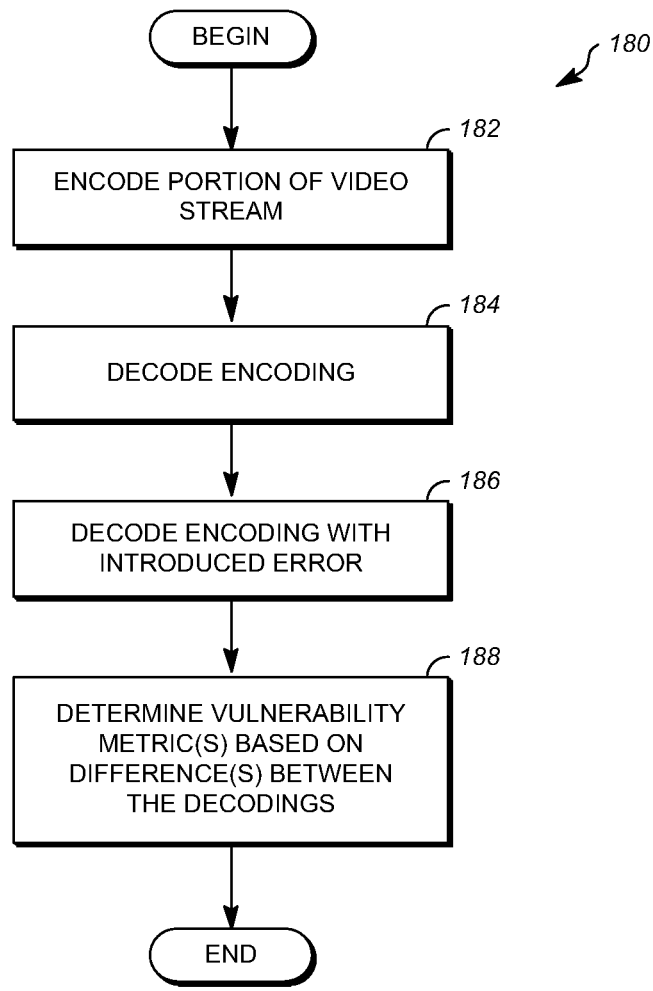
FIG. 9 is a flowchart of a technique of determining one or more vulnerability metrics usable to determine an amount of FEC information generated in the technique of FIG. 8.

FIGS. 7-9 show implementations of using vulnerability metrics generated for a current portion of a video stream based on encoding and decoding the current portion of the video stream, and FIGS. 10-13 show implementations using estimated vulnerability metrics based on one or more training video streams. Although error concealment guided robustness is described with reference to FEC, any data loss mitigation or error correction may be used.

FIG. 1 is a diagram of a video encoding and decoding system 10 in accordance with an embodiment of this disclosure. A transmitting station 12 can be, for example, a computing device having circuitry, such as an internal configuration of circuitry units such as hardware including a processor such as a central processing unit (CPU) 14 and a memory 16. The CPU 14 can be a controller for controlling the operations of the transmitting station 12. The CPU 14 can be connected to the memory 16 by, for example, a memory bus. The memory 16 can be a memory unit, such as a read only memory (ROM), a random access memory (RAM), or any other suitable memory device. The memory 16 can store data and program instructions which can be used by the CPU 14. Other suitable implementations of the transmitting station 12 are possible. As used herein, the term "computing device" includes a server, a hand-held device, a laptop computer, a desktop computer, a special purpose computer, a general purpose computer, or any device, or combination of devices, capable of performing any method, or any portion thereof, disclosed herein.

A network 28 can connect the transmitting station 12 and a receiving station 30 for encoding and decoding of the video stream. Specifically, the video stream can be encoded in the transmitting station 12 and the encoded video stream can be decoded in the receiving station 30. The network 28 can, for example, be the Internet. The network 28 can also be a local area network (LAN), wide area network (WAN), virtual private network (VPN), a mobile or cellular telephone network, or any other means of transferring the video stream from the transmitting station 12.

The receiving station 30, in one example, can be a computing device having circuitry, such as an internal configuration of hardware including a processor such as a central processing unit (CPU) 32 and a memory 34. The CPU 32 may be a controller for controlling the operations of the receiving station 30. The CPU 32 can be connected to the memory 34 by, for example, a memory bus. The memory 34 can be ROM, RAM or any other suitable memory device. The memory 34 can store data and program instructions can be used by the CPU 32. Other suitable implementations of receiving station 30 are possible. For example, the processing of the receiving station 30 can be distributed among multiple devices.

A display 36 configured to display a video stream can be connected to the receiving station 30. The display 36 can be implemented in various ways, including by a liquid crystal display (LCD), a cathode-ray tube (CRT), or a light emitting diode display (LED), such as an OLED display. The display 36 can be coupled to CPU 32 and can be configured to display a rendering 38 of the video stream decoded by a decoder in receiving station 30.

Other implementations of the video encoding and decoding system 10 are possible. For example, an implementation can omit the network 28, the display 36, or both. In an implementation, a video stream can be encoded and stored for transmission at a later time by the transmitting station 12 or any other device having memory. In an implementation, the receiving station 30 can receive (e.g., via network 28, a computer bus, and/or some communication pathway) the encoded video stream and can store the video stream for later decoding. In another implementation, additional components can be added to the video encoding and decoding system 10. For example, a display or a video camera can be attached to the transmitting station 12 to capture the video stream to be encoded. In an implementation, a real-time transport protocol (RTP) is used for transmission. In another implementation, a transport protocol other than RTP may be used, e.g. a Hyper Text Transport Protocol (HTTP)-based video streaming protocol.

Figure 2:
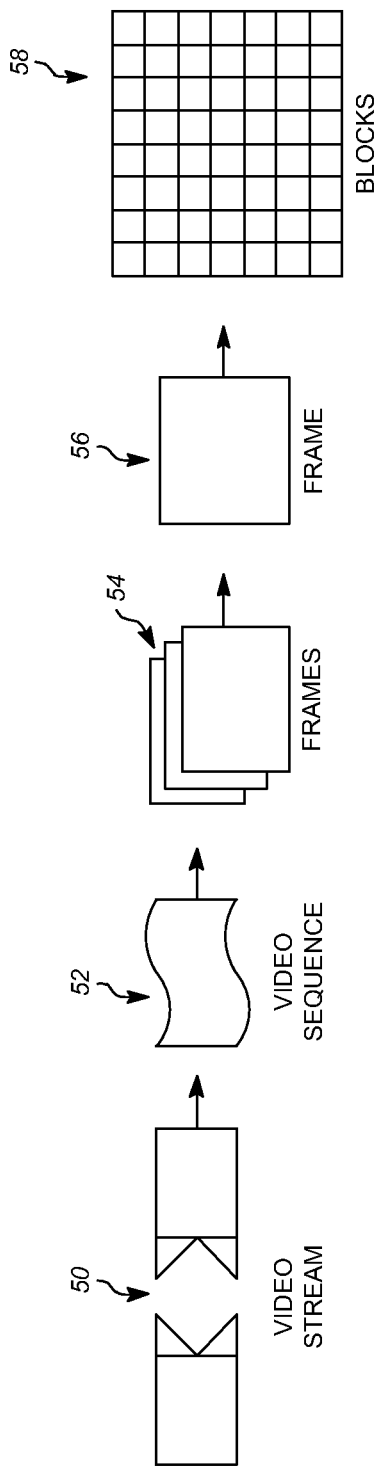
FIG. 2 is a diagram of a video stream to be encoded and decoded.

FIG. 2 is a diagram of a video stream 50 for encoding and decoding in accordance with an embodiment of this disclosure. Video stream 50 includes a video sequence 52. At the next level, the video sequence 52 includes a number of adjacent frames 54. While three frames are depicted in adjacent frames 54, the video sequence 52 can include any number of adjacent frames. The adjacent frames 54 can then be further subdivided into a single frame 56. At the next level, the single frame 56 can be divided into a series of blocks 58. Although not shown in FIG. 2, a block 58 can include pixels. For example, a block can include a 16×16 group of pixels, an 8×8 group of pixels, an 8×16 group of pixels, or any other group of pixels. Unless otherwise indicated herein, the term 'block' can include a macroblock, a segment, a slice, or any other portion of a frame. A frame, a block, a pixel, or a combination thereof can include display information, such as luminance information, chrominance information, or any other information that can be used to store, modify, communicate, or display the video stream or a portion thereof.

Figure 3:
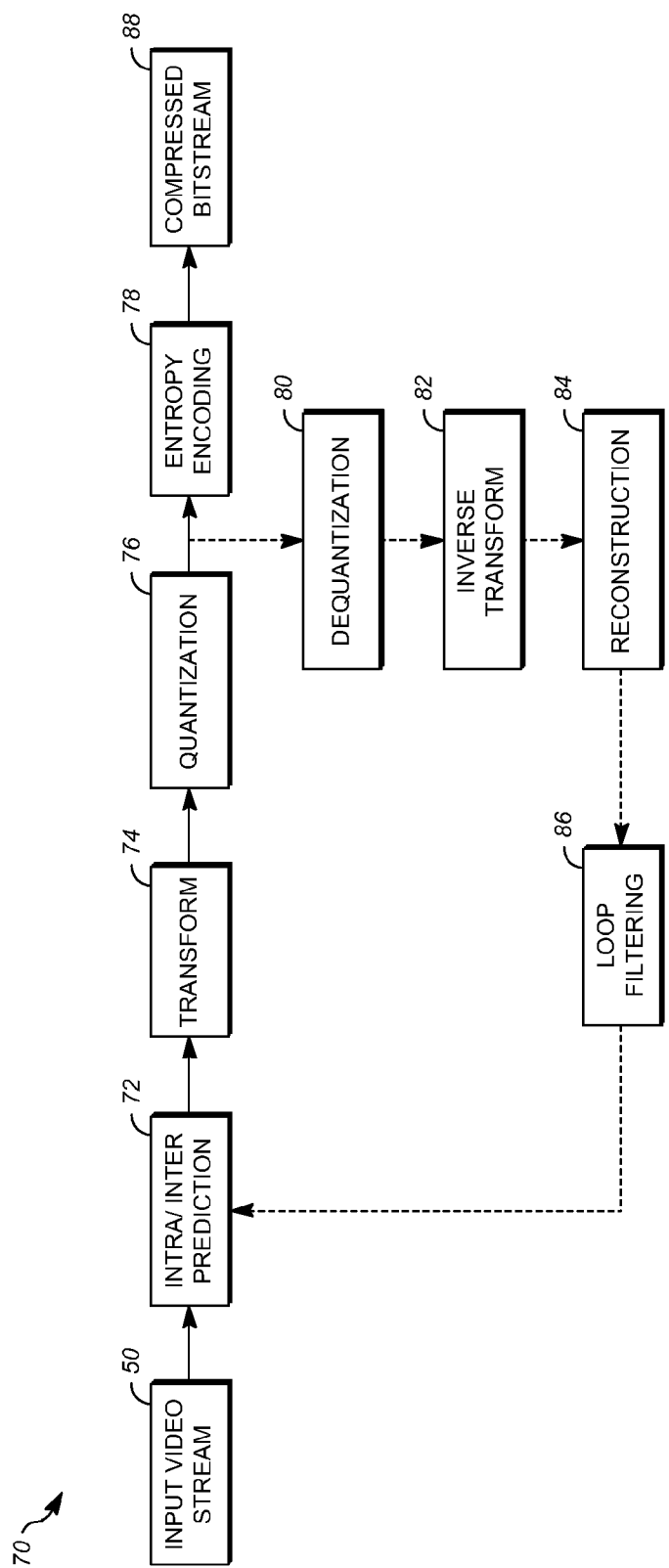
FIG. 3 is a block diagram of a video compression system in accordance with an embodiment of this disclosure.

FIG. 3 is a block diagram of an encoder 70 in accordance with an embodiment of this disclosure. Encoder 70 can be implemented, as described above, in the transmitting station 12 as a computer software program stored in memory 16, for example. The computer software program can include machine instructions that, when executed by CPU 14, cause transmitting station 12 to encode video data in the manner described in FIG. 3. Encoder 70 can be implemented as specialized hardware included, for example, in transmitting station 12. The encoder 70 can encode an input video stream 50. The encoder 70 may have the following stages to perform the various functions in a forward path (shown by the solid connection lines) to produce an encoded or a compressed bitstream 88: an intra/inter prediction stage 72, a transform stage 74, a quantization stage 76, and an entropy encoding stage 78. The encoder 70 can include a reconstruction path (shown by the dotted connection lines) to reconstruct a frame for encoding of further blocks. The encoder 70 may have the following stages to perform the various functions in the reconstruction path: a dequantization stage 80, an inverse transform stage 82, a reconstruction stage 84, and a loop filtering stage 86. Other structural variations of the encoder 70 can be used to encode the video stream 50.

When the video stream 50 is presented for encoding, each frame 56 within the video stream 50 can be processed in units of blocks. At the intra/inter prediction stage 72, each block can be encoded using either intra-frame prediction, which may be within a single frame, or inter-frame prediction, which may be from frame to frame. In either case, a prediction block can be formed. In the case of intra-prediction, a prediction block can be formed from samples in the current frame that have been previously encoded and reconstructed. In the case of inter-prediction, a prediction block can be formed from samples in one or more previously constructed reference frames.

Next, still referring to FIG. 3, the prediction block can be subtracted from the current block at the intra/inter prediction stage 72 to produce a residual block. The transform stage 74 transforms the residual block into transform coefficients in, for example, the frequency domain. Examples of block-based transforms include the Karhunen-Loève Transform (KLT), the Discrete Cosine Transform (DCT), and the Singular Value Decomposition Transform (SVD). In one example, the DCT transforms the block into the frequency domain. In the case of DCT, the transform coefficient values may be based on spatial frequency, with the lowest frequency (i.e. DC) coefficient at the top-left of the matrix and the highest frequency coefficient at the bottom-right of the matrix.

The quantization stage 76 can convert the transform coefficients into discrete quantum values, which may be referred to as quantized transform coefficients or quantization levels. The quantized transform coefficients can be entropy encoded by the entropy encoding stage 78. Entropy encoding can include using a probability distribution metric. The entropy-encoded coefficients, together with the information used to decode the block, which may include the type of prediction used, motion vectors, and quantizer value, can be output to the compressed bitstream 88. The compressed bitstream 88 can be formatted using various techniques, such as variable length coding and entropy coding.

The reconstruction path in FIG. 3 (shown by the dotted connection lines) can be used to help provide that both the encoder 70 and a decoder 100 (described below) with the same reference frames to decode the compressed bitstream 88. The reconstruction path can perform functions that are similar to functions that take place during the decoding process that are discussed in more detail below, including dequantizing the quantized transform coefficients at the dequantization stage 80 and inverse transforming the dequantized transform coefficients at the inverse transform stage 82 to produce a derivative residual block. At the reconstruction stage 84, the prediction block that was predicted at the intra/inter prediction stage 72 can be added to the derivative residual block to create a reconstructed block. The loop filtering stage 86 can be applied to the reconstructed block to reduce distortion such as blocking artifacts.

Other variations of the encoder 70 can be used to encode the compressed bitstream 88. For example, a non-transform based encoder 70 can quantize the residual block directly without the transform stage 74. In another embodiment, an encoder 70 can have the quantization stage 76 and the dequantization stage 80 combined into a single stage.

Figure 4:
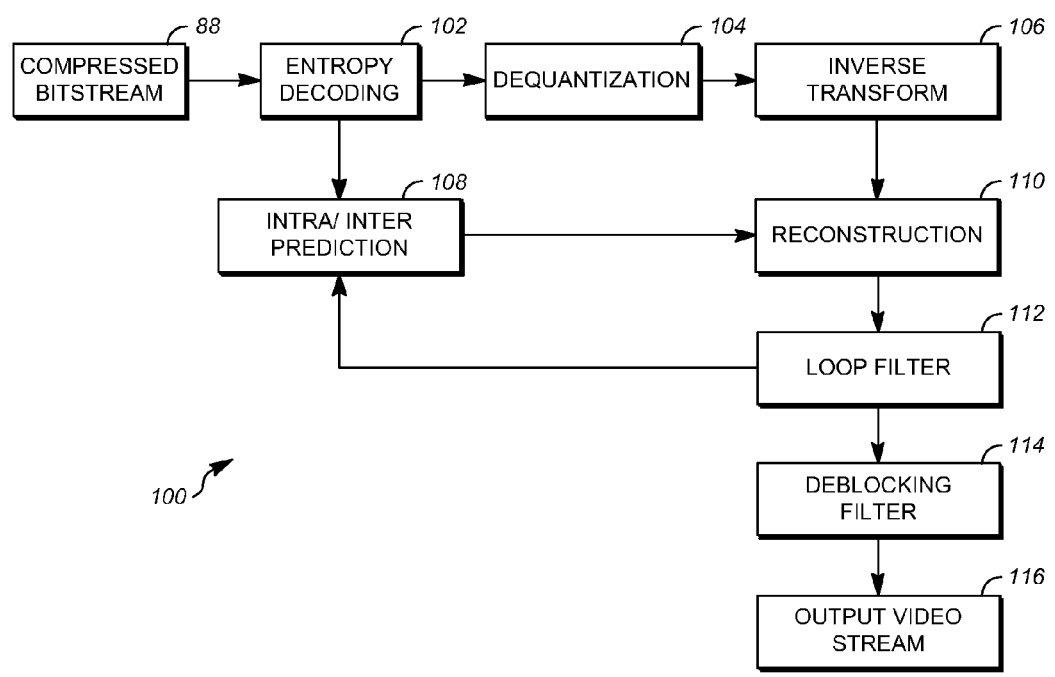
FIG. 4 is a block diagram of a video decompression system in accordance with an embodiment of this disclosure.

FIG. 4 is a block diagram of a decoder 100 in accordance with an embodiment of this disclosure. The decoder 100 can be implemented in a device, such as the receiving station 30 described above, for example, using a computer software program stored in memory 34. The computer software program can include machine instructions that, when executed by CPU 32, cause receiving station 30 to decode video data in the manner described in FIG. 4. Decoder 100 can also be implemented as specialized hardware included, for example, in transmitting station 12 or receiving station 30.

The decoding path of decoder 100, may be similar to the reconstruction path of the encoder 70 discussed above, and can include, in one example, the following stages to perform various functions to produce an output video stream 116 from the compressed bitstream 88: an entropy decoding stage 102, a dequantization stage 104, an inverse transform stage 106, an intra/inter prediction stage 108, a reconstruction stage 110, a loop filtering stage 112 and a deblocking filtering stage 114. Other structural variations of the decoder 100 can be used to decode the compressed bitstream 88.

When the compressed bitstream 88 is presented for decoding, the data elements within the compressed bitstream 88 can be decoded by the entropy decoding stage 102 (using, for example, Context Adaptive Binary Arithmetic Decoding) to produce a set of quantized transform coefficients. The dequantization stage 104 can dequantize the quantized transform coefficients, and the inverse transform stage 106 can inverse transform the dequantized transform coefficients to produce a derivative residual block that can be identical to that created by the inverse transformation stage 82 in the encoder 70. Using header information decoded from the compressed bitstream 88, the decoder 100 can use the intra/inter prediction stage 108 to create the same prediction block as was created in the encoder 70. At the reconstruction stage 110, the prediction block can be added to the derivative residual block to create a reconstructed block. The loop filtering stage 112 can be applied to the reconstructed block to reduce blocking artifacts. The deblocking filtering stage 114 can be applied to the reconstructed block to reduce blocking distortion, and the result is output as the output video stream 116.

Other variations of the decoder 100 can be used to decode the compressed bitstream 88. For example, the decoder 100 can produce the output video stream 116 without the deblocking filtering stage 114.

Figure 5:
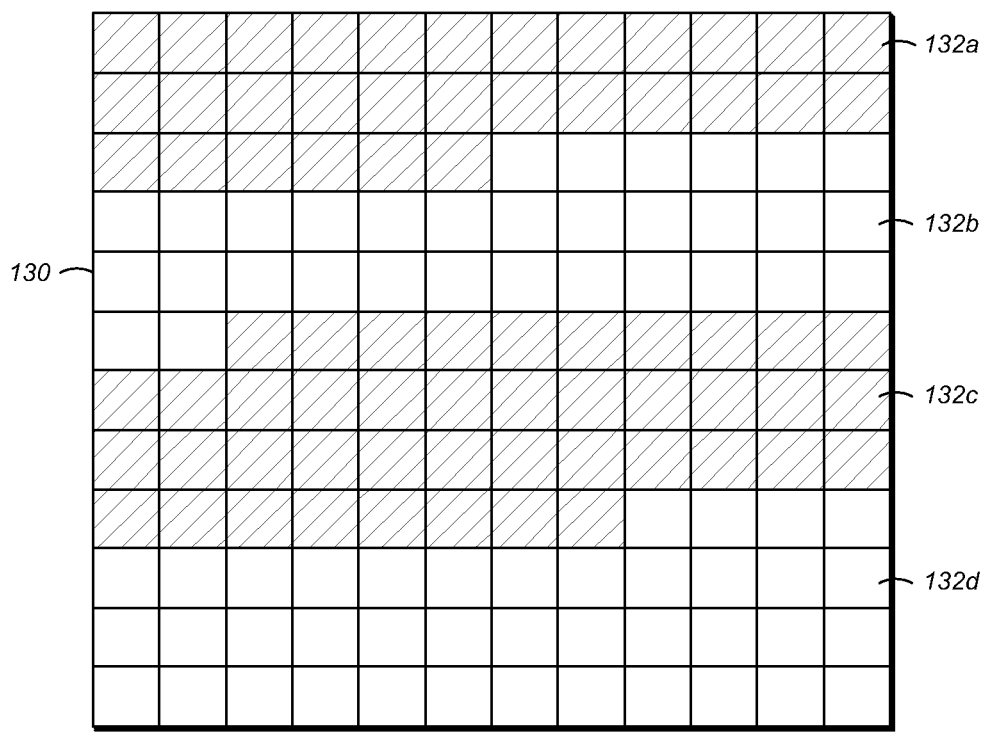
FIG. 5 is a diagram of a frame separated into portions.

FIG. 5 is a diagram of a frame 130 separated into portions 132a-d. Frame 130 can be separated into portions as a part of the encoding process of frame 130. For example, in one implementation, portions 132a-d can be partitions. Partitions can be encoded in an inter-dependent manner, meaning that more than one partition can be required to decode a single partition. The area and/or size of the partitions can be arranged so each partition is able to be packetized into either a single network packet or into multiple network packets. Partitions can also be interleaved.

In another implementation, portions 132a-d can be slices. Slices can be encoded so that each slice is not dependent on other slices for decoding. However, in at least some implementations, when slices are encoded using prediction techniques, slices may refer to reference blocks in other slices. In other implementations, portions 132a-d can be defined as any portion of a frame (including an entire frame) that is identified and used during encoding using any technique or combination of techniques.

Figure 6:
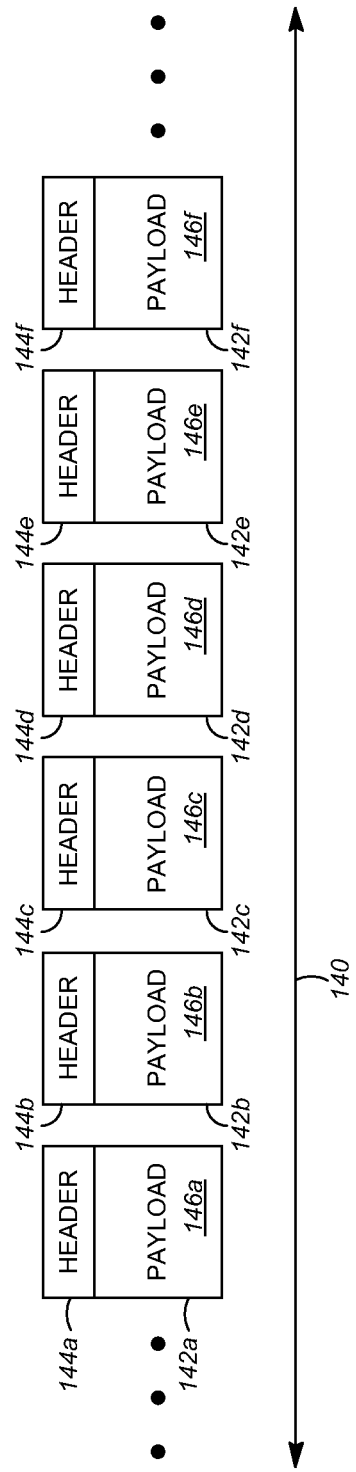
FIG. 6 is a diagram of portions of the frame packetized into network packets.

FIG. 6 is a diagram of portions of frame 130 packetized into network packets 142a-f. The network packets 142a-f are packetized in an order 140. Order 140 can be, for example, based on the raster order of the portions of frame 130. Alternatively, any other order can be used for order 140.

The network packets 142a-f can include headers 144a-f and payloads 146a-f. Headers 144a-f can include transmission information such as source and destination network and hardware addresses. Payloads 146a-f can include data to be transmitted, such as an encoding of portions 132a-d. In one implementation, network packets 142a-f are constructed in accordance with the Transmission Control Protocol (TCP). In other implementations, other network protocols can be used in conjunction with or instead of TCP, such as Internet Protocol (IP), and Realtime Protocol (RTP).

In one implementation, at least some of portions 132a-d can be packetized into more than one of network packets 142a-f. In one example, portion 132a can be packetized into network packet 142a, portion 132b can be packetized into network packets 142b and 142c, portion 132c can be packetized into network packets 142d and 142e, and portion 132d can be packetized into network packet 142f. The above is only one example—there may be any number of portions within a frame, and each portion can be packetized into any number of network packets.

FIG. 7 is a block diagram of a video compression and packetizing system 150 for generating FEC information based on one or more vulnerability metrics. In at least one implementation, system 150 is executed by transmitting station 12 through the use of computer executable instructions.

A video stream is input to two instances of encoder 70 for encoding. The two encodings are then decoded by at least one instance of decoder 100. An introduced error 152 is incorporated into one decoding through at least one of encoder 70, decoder 100, or the intermediate encoding. In one example, the intermediate encoding can be intentionally corrupted or data can be removed. In another example, the process of at least one of encoder 70 or decoder 100 can be altered to introduce an error during at least one of the encoding process or the decoding process.

The other decoding is created normally without an introduced error. The decoded data is passed to vulnerability metric generator 154, which generates at least one vulnerability metric. The vulnerability metric generator 154 can, in at least one implementation, use some or all of the techniques described with respect to FIG. 9.

The encoding without the introduced error is passed to FEC generator 156 along with the generated vulnerability metric(s). FEC generator 156 can generate FEC information to be incorporated with the encoding. The encoding and FEC information is passed to packetizer 158 which packetizes the encoding and FEC information for transmission over a network such as network 14.

This configuration of system 150 is only one possible configuration and other configurations are possible. In one alternative implementation, FEC generator 156 can be placed after packetizer 158. In another alternative implementation, introduced error 152 can be incorporated using one or more different techniques. In one example, only one instance of encoder 70 can be used. Encoder 70 can be used to produce a single encoded data output. A copy of the encoded data output can be made, after which the introduced error 152 can be applied to the copy of the encoded data output. In another example, decoder 100 can be omitted and the reconstruction path of encoder 70, which operates like a decoder, can be used in the place of decoder 100. Other suitable configurations are also available.

FIG. 8 is a flowchart 160 of a technique of generating FEC information for a portion of a video stream. At stage 162, a portion of the video stream is identified for generation of FEC information. At stage 164, at least one vulnerability metric is determined for the identified portion. In at least one implementation, at least one vulnerability metric can be determined for each block of pixels within the identified portion. In at least one alternative implementation, at least one vulnerability metric can be determined per subdivision of the identified portion (i.e. per macroblock or other groupings of pixels). In at least one other alternative implementation, at least one vulnerability metric can be determined for the entire identified portion. In various implementations, the at least one vulnerability metric can include values corresponding to a single metric, multiple metrics, and/or one or more combinations of metrics. Exemplary techniques of determining the vulnerability metric(s) is described later with respect to FIG. 9.

At stage 166, at least one forward error correction strength level F' is determined for the identified portion based on the at least one determined vulnerability metric. In at least one implementation, formulas 1-3 (or a derivation thereof) can be used:

$$\bar{I} = \frac{1}{|P|} \sum_{i \in P} I(i) \quad (1)$$

$$\alpha = 1/I\bar{I} \quad (2)$$

$$F' = \alpha F; \text{ wherein} \quad (3)$$

I is a vulnerability metric or combination thereof;
i is an identifier of the block, macroblock, or other grouping of pixels for which the vulnerability metric is being determined;
P corresponds to the values of i in the portion being encoded;
$\bar{I}$ is a vulnerability metric value attributable to the entire portion;
α is a intermediate modifier value;

T is a threshold value; and

F is an error correction strength level that is determined without regard to a vulnerability metric.

As shown in formula 1, a vulnerability metric Ī attributable to the entire portion can be determined based on the vulnerability metrics I determined for each block, macroblock, or other grouping of pixels within the portion. As shown in formula 2, an intermediate modifier value can be determined using the vulnerability metric Ī and a threshold value T. Depending on implementation, the threshold value T can be a predetermined value, can be determined by the encoder, or can be determined in some other fashion.

The error correction strength level used to encode the portion can be determined using formula 3. In the shown implementation, the error correction strength level used is based on an error correction strength level determined without regard to the vulnerability metric (i.e. using one or more other techniques for determining the forward error correction).

The implementation described above with respect to formulas 1-3 is only one way of determining the error correction strength level to be used. Other implementations are available using, for example, a subset of the shown formulas, modification(s) of the shown formulas, or different formulas. For example, in one alternative implementation, the forward error correction strength level F' is determined without use of error correction strength level F.

In another alternative implementation, portions that are packetized into more than one packet can be encoded to have forward error correction at varying levels for each packet associated with a portion. In some instances, a chosen packet in the portion can be dependent on packets that come before it. Thus, in one example, the forward error correction strength level for the portion can be at its greatest value for the first packet of the portion. The strength level can then be decreased for later packets. As shown in formula 4 below, a vulnerability value $I_{pkt}(k)$ can be determined for each packet k (where, for the first packet, k=1) to determine the forward error correction strength level for each packet k. The vulnerability values $I_{pkt}(k)$ can then be used in a formula similar to formula 2 to determine an intermediate modifier value α for each packet before determining the error correction strength level F' for each packet using a formula similar to formula 3.

$$I_{pkt}(k) = \frac{2(N-k)}{N(N-1)} \bar{I}; \text{ wherein} \quad (4)$$

N is the number of packets associated with the portion.

At stage 168, forward error correction information is generated for the identified portion based on the at least one forward error correction strength. The forward error correction information can be incorporated with an encoding of the identified portion. In at least some implementations, the encoding with the forward error correction information can then be packetized into one or more network packets for transmission over a network. Once received by a receiver, the encoding can be decoded. If a portion of the encoding is lost, the forward error correction information can be used to recover the lost data.

FIG. 9 is a flowchart of a technique 180 of determining one or more vulnerability metrics usable to determine an amount of FEC information generated in the technique 160 of FIG. 8. At stage 182, a portion of a video stream is encoded (such as the portion identified in stage 162 above). At stage 184, the encoded portion is decoded using a decoding process (to produce a "standard decoding" output).

At stage 186, the encoded portion is decoded again using the same decoding process as stage 184, but with an introduced error (to produce an "introduced error decoding" output). The error can be introduced using any number of different techniques. In one example, some of the encoded portion can be deleted before decoding. In another example, some of the encoded portion can be altered or otherwise corrupted before decoding. However, any error introducing technique can be used that is capable of producing an output different than the one produced in stage 184.

The decoding process used in stages 184 and 186 can employ one or more error concealment techniques. An error concealment technique replaces lost or corrupted data in a decoding with data generated from data that was not lost or corrupted. In one implementation, if a block of pixels is lost, it can be replaced based on data from a previous frame. For example, the same block of pixels can be copied from the previous frame. In a second example, a different block of pixels can be copied from the previous frame based on the motion vectors associated with the previous and/or current frame. In a third example, optical flow can be used to estimate motion vectors which can then be used to extrapolate missing pixels using previous frames. In a fourth example, missing pixels can be interpolated from surrounding non-corrupted blocks. The above describes only some exemplary error concealment techniques, and various other error concealment techniques can also be used.

At stage 188, the vulnerability metric(s) are determined based on differences between the two decoded portions. The differences can be determined using any number of techniques, including absolute differences or squared differences. In technique 180, the vulnerability metric(s) are relative indicators of the potential error that can be introduced after data is lost with taking into account the effectiveness of any error concealment that is employed by the decoding process. For example, even if each of a first portion and a second portion encounter the same data loss, the quality of the decoding of the portions can vary based on the effectiveness of error concealment. In other words, error concealment may be able to completely reconstruct the lost data from the first portion yet be unable to reconstruct (or poorly reconstruct) the lost data from the second portion.

Three exemplary vulnerability metrics are described by formulas 5-7 below: a control vulnerability metric $I_{mv}$, a pixel vulnerability metric $I_{pixel}$, and a residual vulnerability metric $I_{res}$.

$$I_{mv}(i) = |MV(i) - \widehat{MV}(i)| \quad (5)$$

$$I_{pixel}(i) = \sum |p(i) - \hat{p}(i)| \quad (6)$$

$$I_{res}(i) = |r(i) - \hat{r}(i)|; \text{ wherein} \quad (7)$$

MV(i) is the value(s) of the control information (i.e. motion vector or coding mode) of the standard decoding;

$\widehat{MV}(i)$ is the value(s) of the control information (i.e. motion vector or coding mode) of the introduced error decoding;

p(i) is the value(s) of the pixels of the standard decoding;

$\hat{p}(i)$ is the value(s) of the pixels of the introduced error decoding;

r(i) is the value(s) of the residual size of the standard decoding; and $\hat{r}(i)$ is the value(s) of the residual size of the introduced error decoding.

With respect to formula 5, the control values can include, for example, the motion vectors or coding modes used to encode the portion. For example, in the process of creating the introduced error decoding, a motion vector can be intentionally lost. In this case, the vulnerability metric $I_{mv}$ is a measure of how well the motion vector is estimated using error concealment. In this case, the poorer the estimate of the motion vector (or coding mode) is, the higher the vulnerability metric will be.

With respect to formula 6, the differences in pixel values are measured. The differences can be calculated in various different ways. As shown, the absolute difference of each spatially correspondent pixel is summed together. The difference can be determined using other techniques as well. For example, the pixels for each portion can be summed, and a difference of the sums of the pixels for each portion can then be taken. As the magnitude of the total differences increases, the vulnerability metric also increases. The differences represent how well the decoding with introduced error can be corrected using error concealment. If the introduced error decoding cannot be corrected well, then the value of the pixel vulnerability metric will be high.

With respect to formula 7, the difference in residual size is measured. When the decoder does not employ residual interpolation error concealment, the residual vulnerability metric indicates whether the area is difficult to predict (thereby resulting in a larger residual). When the decoder does employ residual interpolation error concealment, the residual vulnerability metric indicates how well the residual can be reconstructed. A lower value indicates a good reconstruction, whereas a higher value indicates a poor reconstruction.

The combination of at least some of the vulnerability metrics described above (and, in some implementations, other vulnerability metrics) can produce a balanced metric indicative of the impact of data loss on the associated video. For example, a higher vulnerability metric can indicate that data loss can result in more noticeable video degradation. Correspondingly, a lower vulnerability metric can indicate that the data loss can result in less noticeable video degradation.

Figure 10:
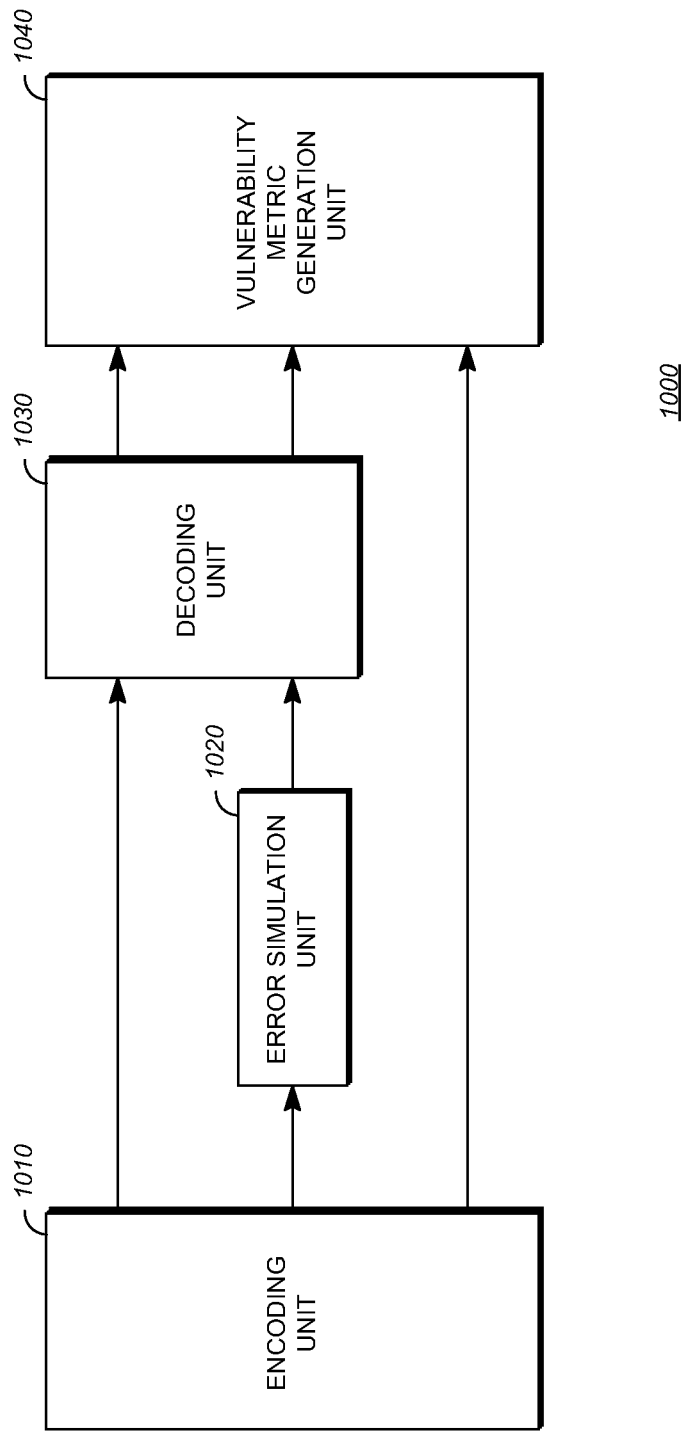
FIG. 10 is a diagram of a learned feature weight generation unit in accordance with an embodiment of this disclosure.
Figure 11:
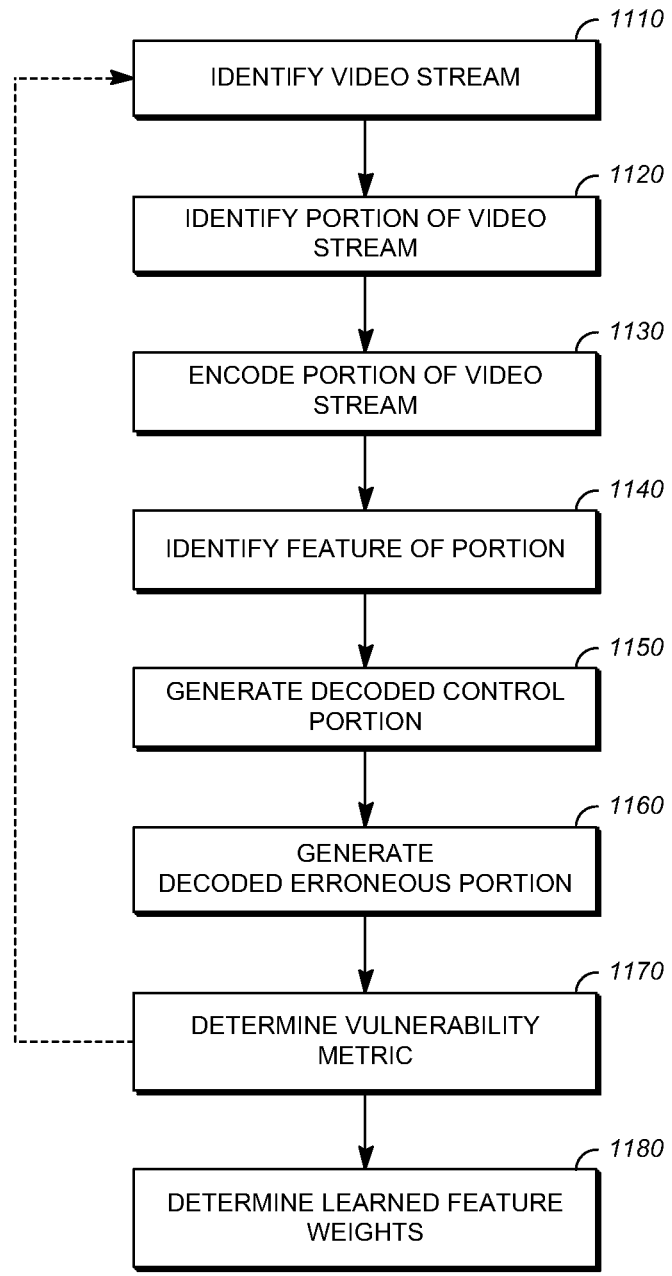
FIG. 11 is a block diagram of learned feature weight generation in accordance with an embodiment of this disclosure.
Figure 12:
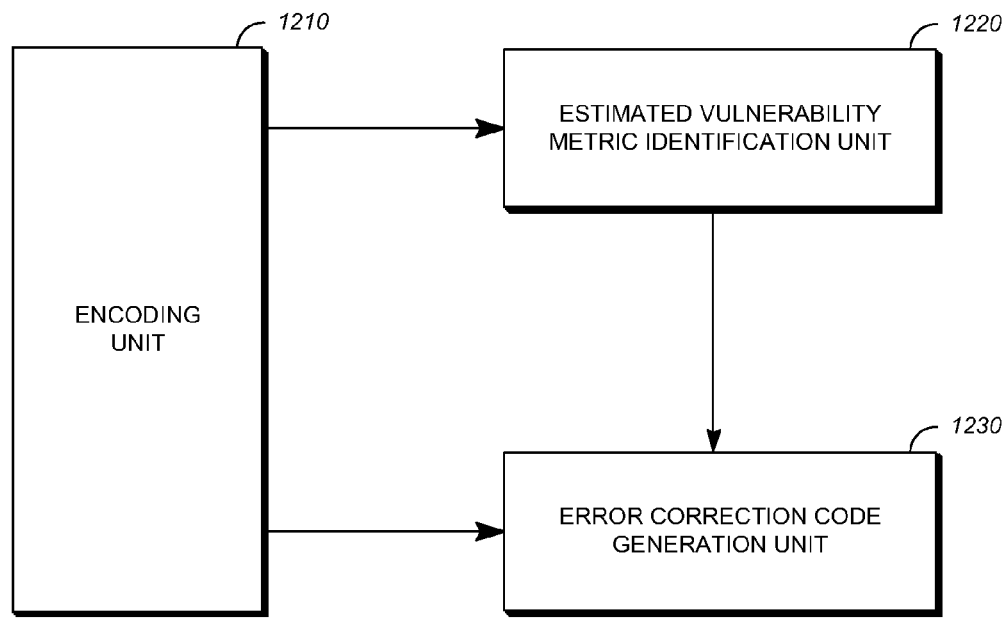
FIG. 12 is a block diagram of a video compression unit for generating error correction information based on one or more estimated vulnerability metrics in accordance with an embodiment of this disclosure.
Figure 13:
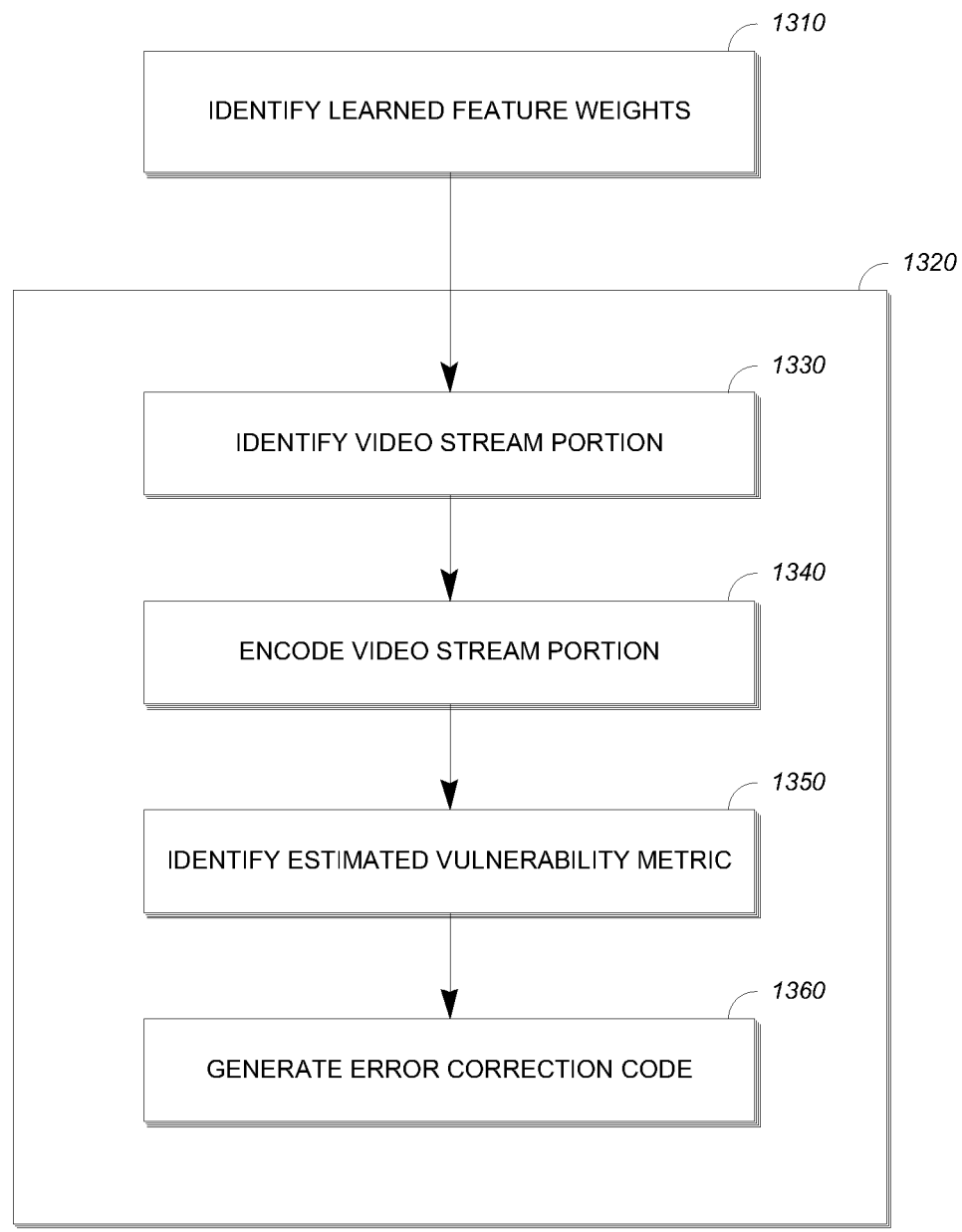
FIG. 13 is a block diagram of error correction using estimated vulnerability metrics in accordance with an embodiment of this disclosure.

Although FIGS. 7-9 show generating error correction codes based on vulnerability metrics, error correction codes may be based on estimated vulnerability metrics. The estimated vulnerability metrics may be identified based on learned feature weights, which may be generated by the transmitting station, or may be received from another device. FIG. 10 shows a diagram of an example of a learned feature weight generation unit. FIG. 11 shows a diagram of an example of learned feature weight generation. FIG. 12 shows a diagram of an example of a unit for generating error correction codes based on estimated vulnerability metrics. FIG. 13 shows a diagram of an example of generating error correction codes based on estimated vulnerability metrics.

FIG. 10 is a diagram of a learned feature weight generation unit 1000 in accordance with an embodiment of this disclosure. In an implementation, a device, such as transmitting station 12 shown in FIG. 1, can include a learned feature weight generation unit 1000. A learned feature weight generation unit 1000 can include an encoding unit 1010, such as the encoder 70 shown in FIG. 3, an error simulation unit 1020, a decoding unit 1030, such as the decoder 100 shown in FIG. 4, a vulnerability metric generation unit 1040, or a combination thereof. A learned feature weight generation unit 1000 may generate learned feature weights using, for example, the learned feature weight generation shown in FIG. 11.

In FIG. 10, the elements 1010-1040 of the learned feature weight generation unit 1000 are shown individually and may be implemented as hardware, such as circuitry, as machine instructions executed by a processor, or as a combination of hardware and machine instructions executed by a processor. For example, a device, such as the transmitting station 12 shown in FIG. 1, can include a processor, such as the CPU 14, and a data storage unit, such as the memory 16, which can include a computer software program stored as machine instructions which can be executed by the processor to generate learned feature weights as described herein. Although FIG. 10 shows distinct units, a learned feature weight generation unit 1000 may be implemented using any configuration of hardware, software, or both. For example, the decoding unit 1030 can be omitted and the encoding unit 1010 can include a reconstruction path, such as the reconstruction path of encoder 70 shown in FIG. 3, which can be used in place of the decoding unit 1030.

In an implementation, the encoding unit 1010 may generate an encoded portion by encoding a portion of a training video stream, and may identify one or more features of the portion of the training video stream. For example, a vector of features f associated with a portion of a video stream can be generated based on, for example, a texture of the portion of the video stream, motion vectors used for encoding the portion of the video stream, residuals used for encoding the portion of the video stream, a position of the portion within the video stream, a mean of absolute differences (MAD), or a combination thereof. In an implementation, the features identified may be based on a predetermined set of features, such as an empirically identified set of features.

The error simulation unit 1020 may receive the encoded portion and may use error prediction to generate a corrupted encoded portion. For example, the error simulation unit 1020 may predict a partial drop or a full drop. A partial drop may indicate a loss of some information associated with the portion of the video stream, such as residuals. A full drop may indicate a loss of more information that a partial drop, such as a loss of residuals and motion vectors. For example, the error simulation unit 1020 may generate the corrupted encoded portion based on the encoded portion, or a copy thereof, and a predicted error, such as a predicted transmission error, by adding corrupted data to the encoded portion, removing data from the encoded portion, or a combination of adding corrupted data and removing data from the encoded portion. Although shown separately, the encoding unit 1010 may be combined with the error simulation unit 1020 and/or the decoding unit 1030. For example, the encoding unit 1010 may generate an encoded portion and generate a corrupted encoded portion.

In an implementation, the decoding unit 1030 may receive the encoded portion, the corrupted encoded portion, or both. The decoding unit 1030 may generate a decoded control portion, a decoded corrupted portion, or both. For example, the decoded control portion may be generated based on the encoded portion, and the decoded corrupted portion may be generated based on the corrupted encoded portion using error concealment. Although shown separately, the error simulation unit 1020 and the decoding unit 1030 may be combined. For example, the decoding unit 1030 may receive an encoded portion, may generate a decoded control portion, may predict error, and may generate a decoded corrupted portion.

In an implementation, the vulnerability metric generation unit 1040 may receive the decoded control portion, the decoded corrupted portion, information indicating the features of the current portion, or a combination thereof. The vulnerability metric generation unit 1040 may identify a vulnerability metric I for the portion of the video stream. For example, the vulnerability metric I may be identified based on a comparison between the decoded control portion and the decoded corrupted portion. The vulnerability metric I may be associated with one or more features of the portion of the training video stream.

The learned feature weight generation unit 1000 may generate learned feature weights based on one or more associations between vulnerability metrics and features using machine learning as described below. The learned feature weight generation unit 1000 may store, transmit, or store and transmit the learned feature weights. For example, in an implementation, a device, such as the transmitting station 12 shown in FIG. 1, may be independent of the learned feature weight generation unit 1000, and may, directly or indirectly, receive data from the learned feature weight generation unit 1000 indicating one or more learned feature weights generated by the learned feature weight generation unit 1000 based on one or more portions of one or more training video sequences.

FIG. 11 is a block diagram of learned feature weight generation 1100 in accordance with an embodiment of this disclosure. Learned feature weight generation 1100 may include using machine learning to generate one or more learned feature weights based on one or more training video streams. Implementations of learned feature weight generation 1100 may include identifying a video stream at 1110, identifying a portion of the video stream at 1120, encoding the portion of the video stream at 1130, identifying a feature of the portion of the video stream at 1140, generating a decoded control portion at 1150, generating a decoded corrupted portion at 1160, determining a vulnerability metric I at 1170, determining learned feature weights at 1180, or a combination thereof. For example, a learned feature weight generation unit, such as the learned feature weight generation unit 1000 shown in FIG. 10, may perform learned feature weight generation as described herein.

In an implementation, a training video stream, such as the video stream 50 shown in FIG. 2, may be identified at 1110. For example, the video stream may be one of many training video streams used for generating learned feature weights. A portion of the video stream, such as a frame, may be identified at 1120. The portion of the video stream may be encoded at 1130. For example, an encoded portion may be generated based on the portion of the video stream, using, for example, the encoding unit 1010 shown in FIG. 10.

A feature of the portion of the video stream may be identified at 1140. Identifying a feature can include identifying a feature value, such as a magnitude of a motion vector. For example, a vector of features f associated with the portion of the video stream can be generated based on, for example, a texture of the portion of the video stream, motion vectors used for encoding the portion of the video stream, residuals used for encoding the portion of the video stream, a position of the portion within the video stream, a mean of absolute differences (MAD), or a combination thereof. In an implementation, an encoder, such as encoding unit 1010 shown in FIG. 10, may identify the feature or features.

A decoded control portion may be generated at 1150. For example, generating a decoded control portion may include decoding the encoded portion using, for example, the decoding unit 1030 shown in FIG. 10.

A decoded corrupted portion may be generated at 1160. In an implementation, decoding a corrupted portion may include using error prediction to generate one or more corrupted encoded portions. For example, a decoded corrupted portion may be generated by generating a corrupted portion based on the encoded portion, or a copy thereof, and a predicted error, and decoding the corrupted portion using error concealment. The corrupted portion may be generated by removing data from the encoded portion, by adding corrupted data to the encoded portion, or by a combination of adding corrupted data and removing data from the encoded portion. For example, the encoded portion may be represented as a bitstream and removing data may include removing bits from the bitstream.

In an implementation, generating a decoded corrupted portion can include using error concealment to generate a decoded corrupted portion without using an encoded corrupted portion. For example, the encoded portion can include a motion vector, a residual, or both. A decoded corrupted portion may be generated based on the encoded portion without using the residual. A decoded corrupted portion may be generated using error concealment to generate the decoded corrupted portion without using the encoded portion.

In an implementation, generating a decoded corrupted portion can include generating one or more decoded corrupted portions. For example, error concealment can be used to generate a first decoded corrupted portion without using the residual, and to generate a second decoded corrupted portion without using the encoded portion. Generating the decoded corrupted portion without using the residual may indicate a predicted error of a partial drop. Generating the decoded corrupted portion without using the encoded portion may indicate a predicted error of a full drop.

A vulnerability metric I may be determined for the portion of the video stream at 1170. Determining the vulnerability metric I may be similar to determining a vulnerability metric I as shown in FIG. 9 at 188. For example, determining vulnerability metrics may include using one or more of formulas 5-7. In an implementation, determining a vulnerability metric I may include generating a first vulnerability metric based on a first decoded corrupted portion and a second vulnerability metric based on a second decoded corrupted portion. For example, the first decoded corrupted portion may be based on decoding the encoded portion without using the residual, and the second decoded corrupted portion may be based on using error concealment without using the encoded portion.

Learned feature weights may be determined at 1180. In FIG. 11, a broken line is shown between identifying a video stream at 1110 and determining a vulnerability metric I at 1170 to indicate that determining learned feature weights at 1180 may include using vulnerability metrics and features associated with one or more portions of one or more training video streams. For example, the learned feature weights can be determined such that, for a given portion of the training stream, a sum of features multiplied by respective feature weights is approximately equal to the value of the vulnerability metric. Implementations of learned feature weight θ determination may include using machine learning to identify estimated relationships between features and vulnerability metrics. For example, relationships can be estimated using an artificial neural network or a least squares estimator.

Using a least squares estimator can include identifying a model, such as a first order polynomial or a second order polynomial, including a linear combination of parameters $\theta_i$. For example, the portion of the video stream may be a frame including M macroblocks, and for each macroblock $MB_i$, identifying an estimated relationship between a vulnerability metric $I_i$ and a vector $f_i$ indicating the features identified for the macroblock $MB_i$ using a first order polynomial may be expressed as the following:

$$I_i = \theta_1 * f_1 + \ldots + \theta_n * f_n; \tag{8}$$

which can be expressed in vector form as the following:

$$I = \theta^T f. \tag{9}$$

The model may be applied to the data by, for example, minimizing the squared error between the model and the data. For example, identifying a relationship for a portion of a video stream may include using a vulnerability metric $I_i$ and N features ($f_{i,j}$), which may be applied to N+1 parameters $\theta_j$, N+1, wherein at least one parameter indicates a non-zero offset.

An optimization of the relationship can be expressed in vector form as the following:

$$\theta = (X^T X)^{-1} X^T I; \quad (10)$$

wherein X indicates a matrix including the features which can be expressed as the following;

$$X = \begin{bmatrix} f_{1,1} & \cdots & f_{1,N1} \\ \vdots & \ddots & \vdots \\ f_{M,1} & \cdots & f_{M,N1} \end{bmatrix};$$

wherein:

$$\theta = [\theta_1 \ldots \theta_{N+1}]^T; \quad (11)$$

$$I = [I_1 \ldots I_M]^T. \quad (12)$$

Implementations of learned feature weight generation 1100 may include using machine learning based on non-linear relationships using, for example, non-linear least squares, which can be optimized using analytic optimization or iterative optimization. In an implementation, a sequential least squares algorithm may be used, which may determine the least square for each macroblock without using a large matrix inversion. In an implementation, learned feature weight generation 1100 may include using an artificial neural network.

In an implementation, learned feature weight generation 1100 may be implemented by a device, such as a device including the learned feature weight generation unit 1000 shown in FIG. 10. For example, the learned feature weights may be generated by a first device and stored in a memory associated with the first device. A second device, such as the transmitting station 12 shown in FIG. 1, may receive the learned feature weights from the first device, may store the learned feature weights in a memory associated with the second device, such as the memory 16 shown in FIG. 1. The second device may include a video compression device, such as the video compression device 1200 shown in FIG. 12, and may use the learned feature weights to identify estimated vulnerability metrics for error correction of a current video stream as shown in FIG. 13.

In other implementations of learned feature weight generation in accordance with this disclosure, additional elements of learned feature weight generation can be added, certain elements can be combined, and/or certain elements can be removed.

FIG. 12 is a block diagram of a video compression unit 1200 for generating error correction information based on one or more estimated vulnerability metrics in accordance with an embodiment of this disclosure. An implementation of a video compression unit 1200 can include an encoding unit 1210, such as the encoder 70 shown in FIG. 3, an estimated vulnerability metric identification unit 1220, an error correction code generation unit 1230, or a combination thereof. In an implementation, a video compression unit 1200 may be implemented by a device, such as the transmitting station 12 shown in FIG. 1, using, for example, computer executable instructions.

In an implementation, the encoding unit 1210 may encode a portion of a video stream, such as a frame, which may be referred to as the current portion. Encoding the current portion may include generating an encoded portion based on the current portion and identifying features of the current portion.

The estimated vulnerability metric identification unit 1220 may identify an estimated vulnerability metric $\hat{I}$ for the current portion based on the features of the current portion. In an implementation, the estimated vulnerability metric $\hat{I}$ may be identified based on a correlation between the features of the current portion and features of portions of a training video streams. For example, the current portion may have a feature, a learned feature weight associated with the feature may be identified based on a portion of a training video stream having the feature, and the estimated vulnerability metric identification unit 1220 may use the learned feature weight to identify an estimated vulnerability metric $\hat{I}$ for the current portion.

Although not shown in FIG. 12, an implementation of a video compression device 1200 can include a packetizer, such as the packetizer 158 shown in FIG. 7. The packetizer may generate one or more packets for storing, transmitting, or storing and transmitting one or more portions of the video stream. The estimated vulnerability metric identification unit 1220 may identify an estimated vulnerability metric $\hat{I}$ for each packet based on a sum of the estimated vulnerability metrics for the portions of the video stream included in the respective packet.

Although shown separately, the encoding unit 1210 and the estimated vulnerability metric identification unit 1220 may be combined. For example, the encoding unit 1210 may generate an encoded portion and identify an estimated vulnerability metric $\hat{I}$.

The error correction code generation unit 1030 may generate an error correction code for storing, transmitting, or storing and transmitting the encoded portion of the video stream based on the estimated vulnerability metric $\hat{I}$.

FIG. 13 is a block diagram of error correction 1300 using estimated vulnerability metrics in accordance with an embodiment of this disclosure. Error correction 1300 using estimated vulnerability metrics may include identifying learned feature weights at 1310 and mitigating predicted error at 1320.

In an implementation, learned feature weights may be identified at 1310. For example, learned feature weights may be identified based on training video streams as shown in FIG. 11. In an implementation, a device, such as the transmitting station 12 shown in FIG. 1, can perform error correction and can receive learned feature weights from another device, such as the learned feature weight generation unit 1000 shown in FIG. 10.

Predicted error may be mitigated at 1320. Mitigating predicted error may include identifying a portion of a video stream at 1330, encoding the portion of the video stream at 1340, identifying an estimated vulnerability metric at 1350, generating an error correction code at 1360, or a combination thereof.

A portion of the video stream, such as a frame, which may be referred to as the current portion, may be identified at 1330. The current portion may be encoded at 1340. Encoding the current portion may include generating an encoded portion based on the current portion and identifying features of the current portion.

An estimated vulnerability metric $\hat{I}$ may be identified at 1350. For example, the estimated vulnerability metric $\hat{I}$ for the current portion may be identified based on the features of the current portion. In an implementation, the estimated vulnerability metric $\hat{I}$ may be identified based on a correlation between the features of the current portion and one or more learned feature weights. For example, the learned feature weights may be generated based on features of portions of one or more training video streams, and an estimated vulnerability metric $\hat{I}$ may be identified based on the features of the current portion and the associated learned feature weights.

A feature of the current block may be associated with one or more feature weights. For example, a feature of the current portion may be associated with a first feature weight $\theta_1$, which may be associated with a first error prediction, such as a partial drop, and may be associated with a second feature weight $\theta_2$, which may be associated with a second error prediction, such as full drop.

An estimated vulnerability metric $\hat{I}$ may be based on one or more learned feature weights. For example, the current portion may be associated with one or more features, and the estimated vulnerability metric $\hat{I}$ may be identified based on a function of the features and learned feature weights associated with each feature. In an implementation, the estimated vulnerability metric $\hat{I}$ may be identified based on a sum of learned feature weights multiplied by corresponding feature values. For example, an estimated vulnerability metric $\hat{I}$ may be identified as shown in formula 9. In an implementation, the estimated vulnerability metric $\hat{I}$ may also or instead be identified based on a sum of outputs of non-linear function(s) of learned feature weight(s) and corresponding feature value(s).

Although not shown in FIG. 13, one or more portions of the video stream may be packetized to generate one or more packets for storing, transmitting, or storing and transmitting the portions of the video stream. An estimated vulnerability metric $\hat{I}$ may be identified for each packet based on a sum of the estimated vulnerability metrics for the portions of the video stream included in each respective packet.

For example, a portion of the video stream may including K macroblocks may be identified at 1330. An encoded macroblock may be generated at 1340 for each of the K macroblocks, which may include identifying a motion vector $MV_i$ for each respective macroblock $MB_i$ and identifying features of each respective macroblock $MB_i$. Estimated vulnerability metrics may be identified for each respective macroblock based on the respective encoded macroblocks and the respective features of the macroblocks at 1350. The motion vectors for the macroblocks may be included in a packet j. The estimated vulnerability metric $\hat{I}$ for the packet j may be generated based on a sum of the estimated vulnerability metrics identified based on each motion vector, which may be expressed as the following:

$$\hat{I}(j)=\Sigma_{k=1}^{K}\hat{I}_{MV}(k) \tag{13}$$

An error correction code can be generated based on the estimated vulnerability metric $\hat{I}$ at 1360. In an implementation, the error correction code can be generated based on the estimated vulnerability metric $\hat{I}$ using formulas 1-4 as described above.

In other implementations of error correction in accordance with this disclosure, additional elements of error correction can be added, certain elements can be combined, and/or certain elements can be removed.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. As used herein, the terms "determine" and "identify", or any variations thereof, includes selecting, ascertaining, computing, looking up, receiving, determining, establishing, obtaining, or otherwise identifying or determining in any manner whatsoever using one or more of the devices shown in FIG. 1.

Further, as used herein, the term "optimize", or any variations thereof, indicates adjusting, identifying, calculating, determining, selecting, or otherwise obtaining an element according to the methods, or any part or parts thereof, described herein and is not limited to a theoretic or practical best. For example, an optimized value may be greater than, less than, or equal to an unoptimized value. As used herein the term "maximize", or any variation thereof, indicates adjusting, identifying, calculating, determining, selecting, or otherwise obtaining an element or value according to the methods, or any part or parts thereof, described herein and is not limited to a theoretic or practical largest value or result. For example, a maximized value may be greater than, less than, or equal to an unmaximized value. As used herein the term "minimize", or any variation thereof, indicates adjusting, identifying, calculating, determining, selecting, or otherwise obtaining an element or value according to the methods, or any part or parts thereof, described herein and is not limited to a theoretic or practical smallest value or result. For example, a minimized value may be greater than, less than, or equal to a minimized value.

Further, for simplicity of explanation, although the figures and descriptions herein may include sequences or series of steps or stages, elements of the methods disclosed herein can occur in various orders and/or concurrently. Additionally, elements of the methods disclosed herein may occur with other elements not explicitly presented and described herein. Furthermore, not all elements of the methods described herein may be required to implement a method in accordance with the disclosed subject matter.

The embodiments of encoding and decoding described herein illustrate some exemplary encoding and decoding techniques. However, it is to be understood that encoding and decoding, as those terms are used herein may include compression, decompression, transformation, or any other processing or change of data.

The embodiments of the transmitting station 12 and/or the receiving station 30 (and the algorithms, methods, instructions, etc. stored thereon and/or executed thereby) can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors or any other suitable circuit. In the claims, the term "processor" should be understood as encompassing any of the foregoing hardware, either singly or in combination. The terms "signal" and "data" are used interchangeably. Further, portions of the transmitting station 12 and the receiving station 30 do not necessarily have to be implemented in the same manner.

Further, in one embodiment, for example, the transmitting station 12 or the receiving station 30 can be implemented using a general purpose computer or general purpose processor with a computer program that, when executed, carries out any of the respective methods, algorithms and/or instructions described herein. In addition or alternatively, for example, a special purpose computer/processor can be utilized which can contain other hardware for carrying out any of the methods, algorithms, or instructions described herein.

The transmitting station 12 and receiving station 30 can, for example, be implemented on computers in a real-time video system. Alternatively, the transmitting station 12 can be implemented on a server and the receiving station 30 can be implemented on a device separate from the server, such as a hand-held communications device. In this instance, the transmitting station 12 can encode content using an encoder 70 into an encoded video signal and transmit the encoded video signal to the communications device. In turn, the communications device can then decode the encoded video signal using a decoder 100. Alternatively, the communications device can decode content stored locally on the communications device, for example, content that was not transmitted by the transmitting station 12. Other suitable transmitting station 12 and receiving station 30 implementation schemes are available. For example, the receiving station 30 can be a generally stationary personal computer rather than a portable communications device and/or a device including an encoder 70 may also include a decoder 100.

Further, all or a portion of embodiments can take the form of a computer program product accessible from, for example, a tangible computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments have been described in order to allow easy understanding of the application are not limiting. On the contrary, the application covers various modifications and equivalent arrangements included within the scope of the appended claims, which scope is to be accorded the broadest interpretation so as to encompass all such modifications and equivalent structure as is permitted under the law.

What is claimed is:

1. A method of generating error correction for a video stream, the method comprising:
   identifying a current portion of a current video stream, the current portion having a feature;
   identifying an estimated vulnerability metric based on a learned feature weight associated with the feature, the estimated vulnerability metric being a value based on comparing:
      a first decoded portion of an encoded training portion of at least one training video stream, the encoded portion including the feature; and
      a second decoded portion of the encoded training portion of the at least one training video stream, the second decoded portion based on the encoded training portion with a simulated transmission error; and
   generating an error correction code for the current portion based on the estimated vulnerability metric.

2. The method of claim 1, further comprising:
   receiving a plurality of learned feature weights including the learned feature weight.

3. The method of claim 1, wherein the generating the error correction code includes using the estimated vulnerability metric to determine an amount of error correction data to include in the error correction code.

4. The method of claim 1, wherein the generating the error correction code includes:
   generating a plurality of packets by packetizing at least the current portion; and
   generating an error correction code for each packet in the plurality of packets.

5. The method of claim 1, wherein the feature includes a vector of features, wherein each feature in the vector of features indicates a value.

6. The method of claim 1, the learned feature weight is generated by:
   identifying the training portion of a training video stream;
   generating the encoded training portion;
   generating the first decoded portion by decoding the encoded training portion;
   generating the second decoded portion by:
      generating a transmission error portion by applying the simulated transmission error to the encoded training portion, and
      decoding the transmission error portion using at least one error concealment technique;
   determining a vulnerability metric based on the first decoded portion and the second decoded portion; and
   determining the learned feature weight based on the feature and the vulnerability metric.

7. The method of claim 6, wherein the generating the learned feature weight includes generating a plurality of learned feature weights based on a plurality of training video streams including the training video stream.

8. The method of claim 6, wherein the generating the learned feature weight includes using machine learning.

9. The method of claim 6, wherein the determining the learned feature weight includes identifying the learned feature weight such that the learned feature weight multiplied by the feature is approximately equal to the vulnerability metric.

10. An apparatus for generating error correction for a video stream, the apparatus comprising:
    a memory; and
    a processor configured to execute instructions stored in the memory to:
       identify a current portion of a current video stream, the current portion having a feature;
       identify an estimated vulnerability metric based on a learned feature weight associated with the feature, the estimated vulnerability metric being a value based on comparing:
          a first decoded portion of an encoded training portion of at least one training video stream, the encoded portion including the feature; and
          a second decoded portion of the encoded training portion of the at least one training video stream, the second decoded portion based on the encoded portion with a simulated transmission error; and
       generate an error correction code for the current portion based on the estimated vulnerability metric.

11. The apparatus of claim 10, wherein the processor is configured to execute instructions stored in the memory to receive a plurality of learned feature weights including the learned feature weight.

12. The apparatus of claim 10, wherein the processor is configured to execute instructions stored in the memory to generate the error correction code by using the estimated vulnerability metric to determine an amount of error correction data to include in the error correction code.

13. The apparatus of claim 10, wherein the processor is configured to execute instructions stored in the memory to generate the error correction code by:
   generating a plurality of packets by packetizing the current portion; and
   generating an error correction code for each packet in the plurality of packets.

14. The apparatus of claim 10, wherein the feature includes a vector of features, wherein each feature in the vector of features indicates a value.

15. The apparatus of claim 10, wherein learned feature weight is generated by:
   identifying the training portion of a training video stream;
   generating the encoded training portion;
   generating the first decoded portion by decoding the encoded training portion;
   generating the second decoded portion by:
      generating a transmission error portion by applying the simulated transmission error to the encoded training portion, and
      decoding the transmission error portion using at least one error concealment technique;
   determining a vulnerability metric based on the first decoded portion and the second decoded portion; and
   determining the learned feature weight based on the feature and the vulnerability metric.

16. The apparatus of claim 15, wherein the processor is configured to execute instructions stored in the memory to generate the learned feature weight by generating a plurality of learned feature weights based on a plurality of training video streams including the training video stream.

17. The apparatus of claim 15, wherein the determining the learned feature weight includes identifying the learned feature weight such that the learned feature weight multiplied by the feature is approximately equal to the vulnerability metric.

18. A method for use in error correction, the method comprising: generating a learned feature weight by:
   identifying a training portion of a training video stream, the training portion having a feature;
   generating an encoded training portion;
   generating a decoded control portion by decoding the encoded training portion;
   generating a decoded corrupted portion by:
      generating a transmission error portion by applying a simulated transmission error to the encoded training portion, and
      decoding the transmission error portion using at least one error concealment technique;
   determining a vulnerability metric based on the decoded control portion and the decoded corrupted portion; and
   determining the learned feature weight based on the feature and the vulnerability metric.

19. The method of claim 18, wherein the determining the learned feature weight includes identifying the learned feature weight such that the learned feature weight multiplied by the feature is approximately equal to the vulnerability metric.

20. The method of claim 19, wherein the generating the learned feature weight includes generating a plurality of learned feature weights based on a plurality of training video streams including the training video stream.

21. The method of claim 19, wherein the learned feature weight is based on a plurality of training video streams including the training video stream.

22. The method of claim 1 wherein the encoded training portion with the simulated transmission error comprises at least one of:
   the encoded training portion with some data deleted; or
   the encoded training portion with some data altered.

23. The apparatus of claim 10 wherein the encoded training portion with the simulated transmission error comprises at least one of:
   the encoded training portion with some data deleted; or
   the encoded training portion with some data altered.

* * * * *